United States Patent
Perez et al.

(10) Patent No.: US 7,656,224 B2
(45) Date of Patent: Feb. 2, 2010

(54) POWER EFFICIENT DYNAMICALLY BIASED BUFFER FOR LOW DROP OUT REGULATORS

(75) Inventors: Raul A. Perez, Richardson, TX (US); Mohammad Ali Odeh Al-Shyoukh, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 492 days.

(21) Appl. No.: 11/081,918

(22) Filed: Mar. 16, 2005

(65) Prior Publication Data
US 2006/0208770 A1    Sep. 21, 2006

(51) Int. Cl.
*G05F 1/10* (2006.01)
(52) U.S. Cl. .................. 327/540; 327/541; 327/543; 323/282; 323/284
(58) Field of Classification Search ......... 327/432–434, 327/540, 541, 543; 323/282, 284
See application file for complete search history.

(56) References Cited

U.S. PATENT DOCUMENTS

| | | | | |
|---|---|---|---|---|
| 4,719,373 | A | * | 1/1988 | Masuda et al. ............... 327/433 |
| 5,001,365 | A | * | 3/1991 | Murabayashi et al. ....... 326/110 |
| 5,867,015 | A | | 2/1999 | Corsi et al. |
| 5,982,226 | A | | 11/1999 | Rincon-Mora |
| 6,188,211 | B1 | | 2/2001 | Rincon-Mora et al. |
| 6,501,305 | B2 | | 12/2002 | Rincon-Mora et al. |
| 6,703,815 | B2 | | 3/2004 | Biagi |

2003/0178980 A1    9/2003 Biagi et al.

OTHER PUBLICATIONS

Carlo Fiocchi, et al. "A Very Flexible BiCMOS Low-Voltage High-Performance Source Follower" IEEE, pp. 212-215, 1999.
Gabriel A Rincon-Mora, et al, "A Low-Voltage, Low Quiescent Current, Low Drop-Out Regulator" IEEE Journal of Solid-State Circuits, vol. 33, No. 1, pp. 36-44, Jan. 1998.
"A Low-Voltage CMOS Low-Dropout Regulator With Enhanced Loop Response," Department of Electrical and Electronic Engineering, The Hong Kong University of Science and Technology, Clear Water Bay, Hong Kong SAR, 2004, pp. I-385 through I-388 (Ka Nang Leung, Philip K.T. Mok and Sai Kit Lau).
"Active Capacitor Multiplier in Miller-Compensated Circuits," IEEE Transactions on Solid State Circuits, vol. 35, No. 1, Jan. 2000, pp. 26-32 (Gabriel A. Rincon-Mora).
"A 1.1-V Current-Mode and Piecewise-Linear Curvature-Corrected Bandgap Reference," IEEE Journal of Solid State Circuits, vol. 33, No. 10, Oct. 1998, pp. 1551-1554 (Gabriel Rincon-Mora).

* cited by examiner

*Primary Examiner*—Kenneth B. Wells
(74) *Attorney, Agent, or Firm*—John J. Patti; Wade J. Brady, III; Frederick J. Telecky, Jr.

(57) ABSTRACT

The buffer circuit includes a first transistor MP1 having a first end coupled to an output node N2 and a control node coupled to an input node N1; a second transistor MN2 coupled to a second end of the first transistor MP1; a third transistor MN1 coupled to the second transistor MN2 such that a current in the third transistor MN1 is mirrored to the second transistor MN2; a first sense device MP3 coupled to the output node N2; a first current source I2 coupled to the output node N2; a second current source I1 coupled to the third transistor MN1; a second sense device MP2 coupled to the third transistor MN1; and a bipolar device Q1 coupled to the output node N2 and having a base coupled to the second end of the first transistor MP1.

6 Claims, 1 Drawing Sheet

POWER EFFICIENT DYNAMICALLY BIASED BUFFER FOR LOW DROP OUT REGULATORS

FIELD OF THE INVENTION

The present invention relates to electronic circuitry and, in particular, to a power efficient dynamically biased buffer for low drop out regulators.

BACKGROUND OF THE INVENTION

Many devices now require low drop out regulators (LDO's) that have stability at very low capacitive loads (1 µF typical). This is attractive for reducing the costs of external components and board area. Also, devices require low dropout voltages and very low power consumption for battery-operated applications.

These requirements force LDO designers to use Miller compensated PMOS LDO's with quiescent current boosting techniques. This is because the output capacitor is no longer large enough to produce a large enough dominant pole and quiescent current boosting (dependent on sensed output current) is required in order to save current during light load conditions and meet transient performance requirements. Transient voltage dip requirement, resulting from sudden load current changes, are more difficult to meet as the load capacitor is reduced.

SUMMARY OF THE INVENTION

A buffer circuit includes a first transistor MP1 having a first end coupled to an output node N2 and a control node coupled to an input node N1; a second transistor MN2 coupled to a second end of the first transistor MP1; a third transistor MN1 coupled to the second transistor MN2 such that a current in the third transistor MN1 is mirrored to the second transistor MN2; a first sense device MP3 coupled to the output node N2; a first current source I2 coupled to the output node N2; a second current source I1 coupled to the third transistor MN1; a second sense device MP2 coupled to the third transistor MN1; and a bipolar device Q1 coupled to the output node N2 and having a base coupled to the second end of the first transistor MP1.

DETAILED DESCRIPTION OF PREFERRED EMBODIMENTS

The present invention includes a buffer stage that drives the power PMOS device of an LDO while maintaining good transient performance, system stability, and very good power efficiency.

Figure 1:
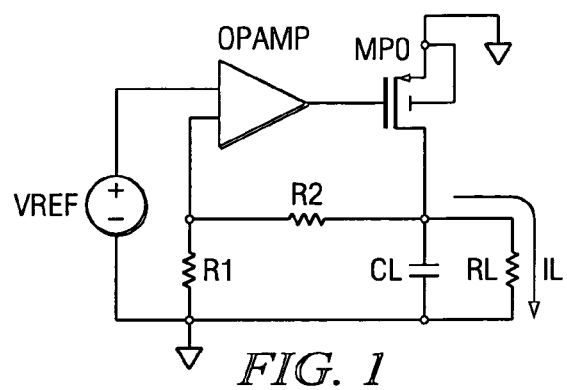
FIG. 1 is a circuit diagram of a low drop out voltage regulator.

A low dropout regulator, in this case an LDO with a PMOS output device, is shown in FIG. 1. The circuit of FIG. 1 includes PMOS output device MP0; operational amplifier OPAMP; feedback resistors R1 and R2; load resistor RL; load capacitor CL; voltage reference VREF; and load current IL. The output device MP0 of FIG. 1 is a power PMOS device that is usually a minimum channel device that needs to source anywhere between a few microamps to hundreds of milliamps of current. In order for this device to meet dropout requirements it needs to be a very large device. This in turn makes the parasitic capacitances associated with this device very large. This very large capacitance has significant repercussions for the transient response of the LDO, since the capacitances have to be charged and discharged for the LDO loop to respond to a load current increase or decrease.

Figure 2:
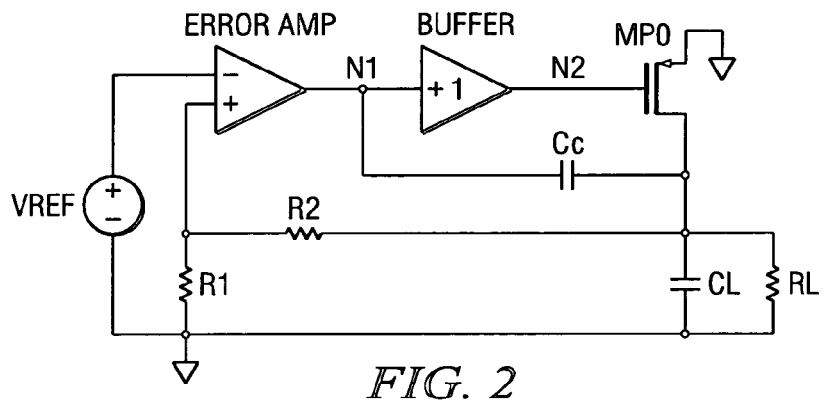
FIG. 2. is a circuit diagram of a low drop out regulator showing the main blocks inside the operational amplifier of FIG. 1.

In FIG. 2, the main blocks inside the operational amplifier OPAMP of FIG. 1 are shown. These are an Error amplifier and a non-inverting unity gain Buffer. The circuit of FIG. 2 also includes capacitor Cc. There is always the alternative of driving the gate of the PMOS device directly from the high impedance node of the error amplifier. But this would require a large amount of static current to be used in the high impedance node of the error amplifier in order to obtain less than 100 mV (typical requirement) dip of output voltage during transient events at the output of the LDO. This would significantly degrade the efficiency of the LDO, an unacceptable tradeoff in today's power critical applications. An additional trade-off is that the highest achievable gain of the error amplifier is inversely proportional to the drain current of the devices in the high impedance node. A reduced gain would result in greater load regulation errors, and cause regulation to be less accurate. There are circuits that operate in parallel with the error amplifier to pull the gate up or down during transient events. But these circuits at a minimum add additional noise sources to the error amplifier and many are unstable due to too many inverting stages in series.

The present invention is focused mainly on the requirements of the case where the PMOS device is driven by a buffer. This buffer can be implemented in many different ways; it could be a source follower transistor, an opamp in unity gain configuration, etc.

The ideal buffer will have the following properties:

Low enough output impedance so that the pole created by the impedance at node N2 and the gate capacitance of the PMOS device doesn't make the system unstable.

A DC voltage offset in order to ensure that the error amplifier's high impedance node N1 doesn't have to swing higher than the required saturation voltage (Vdsat) of the PMOS devices in the active load of that gain stage. This is entirely possible, since the PMOS device is a huge device and under no load conditions is probably only sourcing microamps of current for the feedback resistors. Leakage at higher temperatures alone in the PMOS power device is typically in the microamp range, which exacerbates the problem even more. This leads to a gate-to-source voltage (Vgs) for the output PMOS to be less than 100 mV for high temperature conditions (e.g. 125 C.). This will surely be less than the VCsat of any active load and will crush the gain stage. Inevitably the output voltage will drift high under these conditions. Having enough DC offset in the buffer will ensure that the active load has enough headroom to stay in the saturation region.

Gain of buffer has to be higher or equal to 0dB up to the frequency that the LDO loop's phase has shifted 180° degress. In other words, the unity gain frequency of the buffer has to be about one decade higher than the frequency of the second pole of the LDO. If this condition is not met the LDO will have an oscillation on top of the regulated voltage.

The first and third properties are tied together and are the small signal AC characteristics required. The second is a DC requirement in order to maintain regulation at no load-especially important for digital loads.

One prior art technique (A LOW-VOLTAGE, LOW QUIESCENT CURRENT, LOW DROP-OUT REGULATOR, Rincon-Mora, G. A; Allen, P. E.; Solid-State Circuits, IEEE Journal of, Volume: 33, Issue: 1, Jan. 1998) proposed increasing the bias current of a bipolar buffer device that is driving the PMOS power device, proportional to the load current. This achieves maximum efficiency since at no load the LDO is consuming minimum bias current. As load current is increased the bias current of the buffer is increased, but this doesn't really affect efficiency much because of the low quiescent current, Iq, of the LDO as compared to the load current. This prior art technique would have to be modified by using a PMOS device as a buffer device in order to obtain a DC voltage offset. Because of this, the prior art technique might not always do the job because the impedance looking into the source of the PMOS is not low enough and the transconductance (gm) of the MOSFET increases only with the square root of the bias current. Consequently, to decrease this impedance ever-increasing amounts of current would be required.

A way to lower the output impedance is by adding feedback, as explained in A VERY FLEXIBLE BICMOS LOW-VOLTAGE HIGH-PERFORMANCE SOURCE FOLLOWER, Fiocchi, C.; Gatti, U.; Circuits and Systems, 1999. ISCAS '99. Proceedings of the 1999 IEEE International Symposium on, Volume: 2, 30 May-2 Jun. 1999, Pages 212-215 vol. 2. However, adding negative feedback will slow down the buffer. This buffer would end up using more static current.

Figure 3:
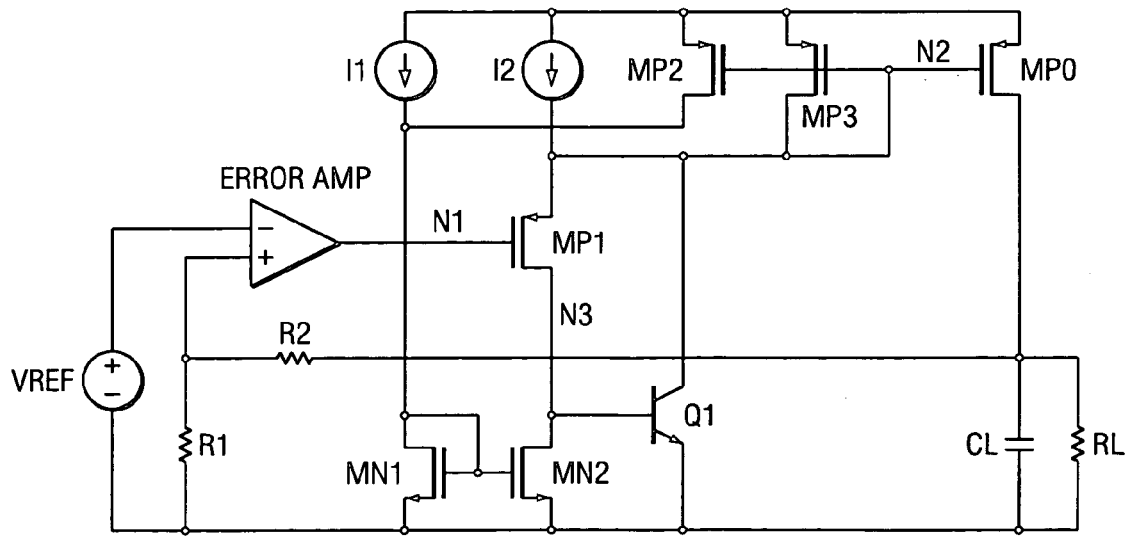
FIG. 3. is a circuit diagram of a preferred embodiment low drop out regulator with a buffer circuit, according to the present invention.

A preferred embodiment circuit shown in FIG. 3 includes a buffer, according to the present invention, that has very low output impedance due to the feedback and whose bandwidth is increased proportional to the load current. The circuit of FIG. 3 includes PMOS output device MP0; error amp; feedback resistors R1 and R2; load resistor RL; load capacitor CL; voltage reference VREF; and buffer circuit which includes sense devices MP2 and MP3, current sources I1 and I2, transistors MP1, MN1, MN2, and NPN bipolar device Q1. An NPN bipolar device Q1 is used because the gm of bipolars increases linearly with collector current making the stabilization of the local feedback loop of the buffer possible with less current than it would have been if a MOSFET had been used. Capacitance at node N3 has to be minimized by using a minimum emitter sized bipolar Q1. During no load, sense devices MP2 and MP3 have zero drain current. So the drain current of transistor MN2 sets the current through transistor MP1, and the rest of the current provided by current source I2 will flow through the bipolar Q1. Transistor MP1's gm sets the unity gain frequency of the buffer and the gm of the bipolar Q1 pushes the second pole of the local buffer loop into higher frequency to maintain system stability. When there is some load current, sense devices MP2 and MP3 change the ratioing of the currents through devices MP1 and Q1. The ratios and absolute magnitude values of bias current (static and load dependent) are decided by the stability criteria of the loop.

Certain compensation schemes for the error amplifier will impose different constraints on the needed bandwidth of the buffer. Compensation to a low impedance node (like the source of the common gate transistor of a folded cascode amplifier) gives a much wider bandwidth power supply rejection ratio (PSRR). This compensation pushes the second pole of the LDO to higher frequencies, increasing the required bandwidth of the buffer and by consequence the power required to achieve it. This buffer structure offers a good balance between the impedance reduction that using feedback offers and the minimum amount of components to obtain the bandwidth needed in the most power efficient way.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. An apparatus comprising:
a first MOS transistor that is coupled to an output node at its drain;
a voltage divider that is coupled to the output node;
an error amplifier having a first input terminal, a second input terminal, and an output terminal, wherein the first input terminal is coupled to the voltage divider, and wherein the second input terminal receives a reference voltage;
a buffer having:
a first current source;
a current mirror that is coupled to the first current source;
a second current source that is coupled to the gate of the first MOS transistor;
a second MOS transistor that is coupled between the second current source and the current mirror and that is coupled to the output terminal of the error amplifier at its gate;
a third MOS transistor that coupled in parallel to the first current source and that is coupled to the gate of the first MOS transistor at its gate; and
a fourth MOS transistor that is coupled in parallel to the second current source and that is coupled to the gate of the first MOS transistor at its gate.

2. The apparatus of claim 1, wherein the first MOS transistor is a PMOS transistor.

3. The apparatus of claim 1, wherein the current mirror further comprises:
a first NMOS transistor that is coupled to the first current source at its drain and that is diode-connected; and
a second NMOS transistor that is coupled to the second MOS transistor at its drain and that is coupled to the gate of the first NMOS transistor at its gate.

4. The apparatus of claim 1, wherein the buffer further comprises an NPN transistor that is coupled to the second current source at its collector and the current mirror at its base.

5. The apparatus of claim 1, wherein the voltage divider further comprises a plurality of resistors coupled in series with one another.

6. An apparatus comprising:
a first NMOS transistor that is coupled to an output node at its drain;
a first resistor that is coupled to the output node;
a second resistor that is coupled to the first resistor;
an error amplifier having a first input terminal, a second input terminal, and an output terminal, wherein the first input terminal is coupled to the first and second resistors, and wherein the second input terminal receives a reference voltage; and a buffer having:
   a first current source;
   a first NMOS transistor that is coupled to the first current source at its drain and that is diode-connected; and
   a second NMOS transistor that is coupled to the gate of the first NMOS transistor at its gate;
a second current source that is coupled to the gate of the first PMOS transistor;
a second PMOS transistor that is coupled to the second current source at its source, that is coupled to the drain of the second NMOS transistor at its drain, and that is coupled to the output terminal of the error amplifier at its gate;
a third PMOS transistor that coupled in parallel to the first current source and that is coupled to the gate of the first PMOS transistor at its gate;
a fourth MOS transistor that is coupled in parallel to the second current source and that is coupled to the gate of the first PMOS transistor at its gate; and
an NPN transistor that is coupled to the second current source at its collector and the drain of the second NMOS transistor at its base.

* * * * *

UNITED STATES PATENT AND TRADEMARK OFFICE
CERTIFICATE OF CORRECTION

| | | |
|---|---|---|
| PATENT NO. | : 7,656,224 B2 | Page 1 of 1 |
| APPLICATION NO. | : 11/081918 | |
| DATED | : February 2, 2010 | |
| INVENTOR(S) | : Perez et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 127 days.

Signed and Sealed this

Twenty-eighth Day of December, 2010

David J. Kappos
*Director of the United States Patent and Trademark Office*